United States Patent [19]

Sakudo et al.

[11] Patent Number: 4,801,847

[45] Date of Patent: Jan. 31, 1989

[54] CHARGED PARTICLE ACCELERATOR USING QUADRUPOLE ELECTRODES

[75] Inventors: Noriyuki Sakudo, Ome; Katsumi Tokiguchi, Machida; Hidemi Koike, Tokorozawa; Osami Okada, Chofu; Norio Saito, Iruma; Susumu Ozasa, Kashiwa, all of Japan

[73] Assignee: Hitachi, Ltd., Tokyo, Japan

[21] Appl. No.: 763,133

[22] PCT Filed: Nov. 22, 1984

[86] PCT No.: PCT/JP84/00557

§ 371 Date: Jul. 29, 1985

§ 102(e) Date: Jul. 29, 1985

[87] PCT Pub. No.: WO85/02489

PCT Pub. Date: Jun. 6, 1985

[30] Foreign Application Priority Data

Nov. 28, 1983 [JP] Japan ............... 58-222032
Dec. 2, 1983 [JP] Japan ............... 58-226860
Dec. 2, 1983 [JP] Japan ............... 58-226861

[51] Int. Cl.⁴ .................................... H01J 25/10
[52] U.S. Cl. ...................... 315/5.41; 315/5.44; 315/5.42; 315/3; 330/4.6; 330/4.7
[58] Field of Search ............ 315/5.41, 5.35, 5.42, 315/5, 4, 3, 336, 5.44; 330/4.7 X, 4.6

[56] References Cited

U.S. PATENT DOCUMENTS

| | | | |
|---|---|---|---|
| 3,147,445 | 9/1964 | Wuerker et al. | 315/3 |
| 3,148,302 | 9/1964 | Clavier et al. | 330/4.7 |
| 3,252,104 | 5/1966 | Gordon | 330/4.7 |
| 3,300,728 | 1/1967 | Adler | 330/4.7 |
| 3,315,152 | 4/1967 | Lindley | 330/4.7 |
| 3,449,678 | 6/1969 | Wade | 330/4.7 |
| 3,916,255 | 10/1975 | Crandall | 315/3 |
| 4,360,760 | 11/1982 | Brodowski | 315/5.41 |
| 4,392,080 | 7/1983 | Maschke | 315/5.41 |
| 4,490,648 | 12/1984 | Lancaster et al. | 315/5.41 |

*Primary Examiner*—David K. Moore
*Assistant Examiner*—Michael Razavi
*Attorney, Agent, or Firm*—Antonelli, Terry & Wands

[57] ABSTRACT

A charged particle accelerator is provided with quadrupole electrodes with surfaces that are opposed to each other and are undulated, and with an external resonance circuit. The external resonance circuit consists of a capacitor formed by the opposing electrodes, a variable capacitor provided in parallel with said capacitor, and a coil. The resonance frequency is variable. A direct current and an alternating current may be applied in a superposed manner to the quadrupole electrodes. The thus constructed accelerator can be employed for an ion implanter to implant a heavy-current ion beam of several hundred KeV to several MeV.

8 Claims, 5 Drawing Sheets

CHARGED PARTICLE ACCELERATOR USING QUADRUPOLE ELECTRODES

TECHNICAL FIELD

The present invention relates to a charged particle accelerator using quadrupole electrodes, and particularly to a charged particle accelerator using quadrupole electrodes, which efficiently accelerates various kinds of ions to any energy level.

BACKGROUND ART

A charged particle accelerator using quadrupole electrodes can be represented, for instance, by an RFQ (radio-frequency quadrupole) ion accelerator.

FIG. 1 shows the construction of a conventional RFQ ion accelerator. Opposing surfaces of quadrupole electrodes 2, 4, 6, 8 are undulating. FIG. 2 illustrates the undulating condition in vertical cross section and in horizontal cross section. Namely, FIG. 2(a) is a vertical cross section, and FIG. 2(b) is a horizontal cross section. A high frequency is applied to these electrodes. The electrodes 4 and 8 assume the negative polarity when the electrodes 2 and 6 assume the positive polarity, and the electrodes 4 and 8 assume the positive polarity when the electrodes 2 and 6 assume the negative polarity. As shown in in FIG. 2, furthermore, the electrodes 2, 6 and the electrodes 4, 8 have protrusions and recesses that are deviated by 180° in phase. Therefore, when the electrodes 2, 6 assume the positive polarity and the electrodes 4, 8 assume the negative polarity, an electric field is established in the axial direction on the center axis as shown in FIG. 2. When the polarities of voltages applied to the electrodes are reversed, the direction of electric field is reversed in FIG. 2. If now an ion enters into the electric field established in the quadrupole electrodes from the left in FIG. 2 at a speed and in phase such that it always receives an acceleration field directed toward the right, then the energy of the ion increases monotonously. Further, an ion which has entered in a phase in which it is decelerated at first, is bunched in the succeeding particles and is then accelerated monotonously. In the radio-frequency quadrupole as described above, the ions that enter in any r-f phase can finally be accelerated efficiently while utilizing the focusing produced by the r-f electric field in the vertical and horizontal directions. Therefore, a very high transmission factor is obtained.

In the conventional apparatus, an accelerating tube 10 forms an r-f cavity resonator together with the electrodes 2, 4, 6, 8. FIG. 3 is a section view of a conventional radio-frequency quadrupole, wherein reference numeral 18 denotes an r-f cable for supplying an r-f electric power to the cavity resonator. An end 20 of a central conductor forms a coupler in the form of a loop antenna. The resonance frequency of the resonator is determined by the geometrical size thereof, and cannot be changed. In the case of an H+ accelerator of 100 MHz, for instance, the length will be about 1.5 meters and the diameter will be about 0.5 meter. When other ion species are to be accelerated using this apparatus, it is necessary to increase the incident energy in proportion to the mass m to bring the incident speed to be the same as that of H+ ions, since the energy of an ion is given by $eV = \frac{1}{2}mv^2$ (where e denotes the electric charge of an electron, V denotes an ion acceleration voltage, m denotes the mass of an ion, and v denotes the speed of an ion). Therefore, the exit energy also increases in proportion to the mass m. Namely, with the radio-frequency quadrupole which accelerates H+ ions to 1 MeV, As+ can be accelerated to 75 MeV.

Such characteristics are not suited for implanting a variety of kinds of ions at various energies, that is required by an ion implanter.

From a different point of view, to realize an accelerator for exclusively accelerating As+ ions to 1 MeV relying upon the radio-frequency quadrupole, the length should be reduced to 1/75 while maintaining the frequency unchanged, or the frequency should be decreased to 1/75 while maintaining the length unchanged. In the former case, the distance between the recess and the protrusion on the electrode surfaces is reduced to 1/75, presenting a problem from the standpoint of machining the electrodes. In the latter case, the diameter of the accelerating tube must be increased by about 75 times to establish the resonance condition for the cavity resonator, which is not realistic.

In the conventional system of the construction shown in FIG. 1, inner walls of the accelerating tube are contaminated by the ion sputtering after being operated for extended periods of time. Namely, reduction in the Q-value of the cavity resonator makes it difficult to generate a voltage maintaining a predetermined high frequency.

Disclosure of Invention

The object of the present invention is to provide an ion accelerator which is capable of accelerating a variety of kinds of ions to any energy ranging from several hundred kiloelectron-volts to several megaelectron-volts, while eliminating the aforementioned problems, making it possible to realize an ion implanter of a high voltage and a heavy current.

According to the conventional system as described above, it is not allowed to change the frequency. If the frequency is lowered, the accelerating tube must be increased in size, and it becomes difficult to maintain a Q-value of the cavity resonator. In order to preclude these difficulties according to the present invention, provision is made of an external resonance circuit for a charged particle accelerator which uses quadrupole electrodes.

BEST MODE FOR CARRYING OUT THE INVENTION

An embodiment of the invention will be explained below with reference to FIG. 4.

Figure 1:
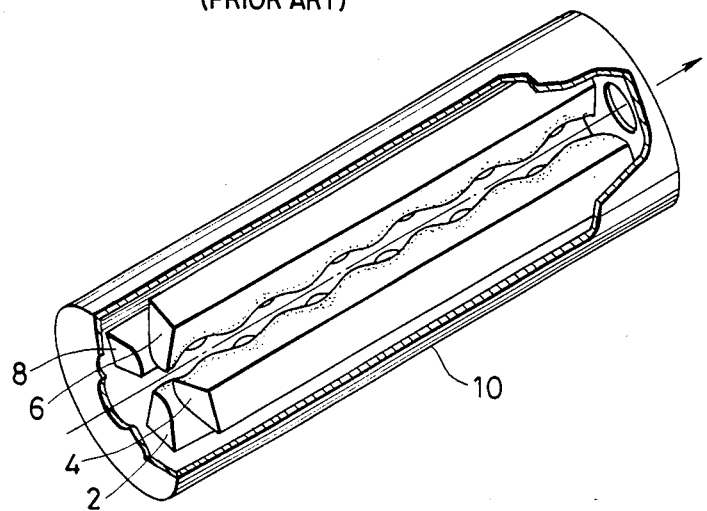
FIG. 1 is a diagram showing the construction of conventional RFQ accelerator.
Figure 2A:
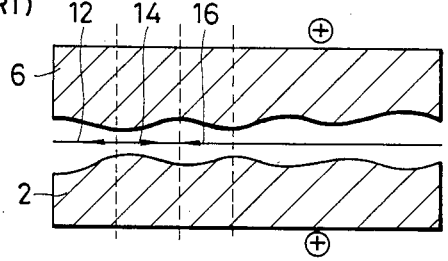
FIGS. 2(a) and 2(b) are a diagram for explaining the operation an RFQ accelerator.
Figure 2B:
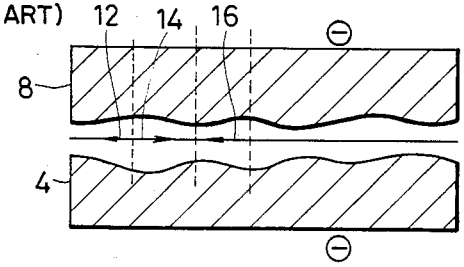
Figure 3:
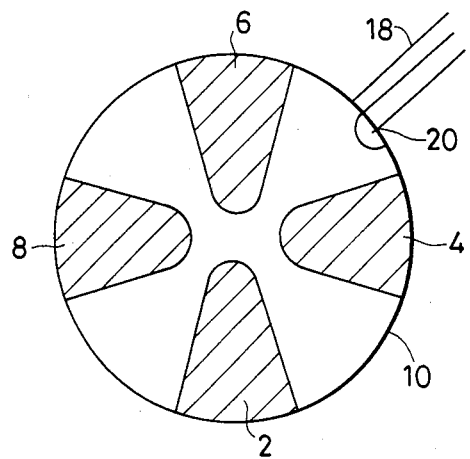
FIG. 3 is a diagram showing the construction of the conventional RFQ accelerator from the standpoint of electric circuits and showing how to supply radio-frequency waves.
Figure 5:
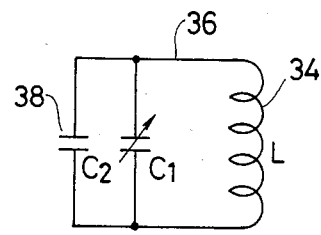
FIG. 5 is a diagram illustrating an electric equivalent circuit according to the present invention.

Quadrupole electrodes 22, 24, 26 and 28 are insulated from an accelerating tube 32 via insulators 30. A resonance circuit consisting of a coil 34 having an inductance L and a variable capacitor 36 having a capacity $C_1$ is installed outside the accelerating tube 32. The equivalent circuit of this case is shown in FIG. 5, wherein a capacitor 38 is equivalent to a stray capacity $C_2$ among the quadrupole electrodes 22, 26, and 24, 28. Therefore, a resonance frequency of this resonance circuit is given by $$\frac{1}{2\pi \sqrt{L(C_1 + C_2)}}$$

which is tuned to the output frequency of an oscillator 40. The output of the oscillator 40 is amplified through an amplifier 42, and is supplied to the resonance circuit through a coupling coil 44. Therefore, when the ions of a different kind are to be accelerated, the frequency should be changed depending thereupon to properly determine the output energy.

In order to further improve the above system, there can be established a mechanism in which the frequency of the oscillator 40 is set being interlocked to the frequency of the resonance circuit which consists of coil 34, variable capacitor 36 and capacitor 38 having an inter-electrode capacity $C_2$.

Further, an oscillator can be constituted by applying a positive feedback from the external resonance circuit to the amplifier 42. In this case, the oscillator 40 can be eliminated.

By providing a plurality of external circuits, furthermore, sinusoidal waves of a plurality of frequencies can be superposed on the electrodes, making it possible to obtain a waveform close to, for example, a rectangular wave, thereby to increase the acceleration efficiency.

Figure 6:
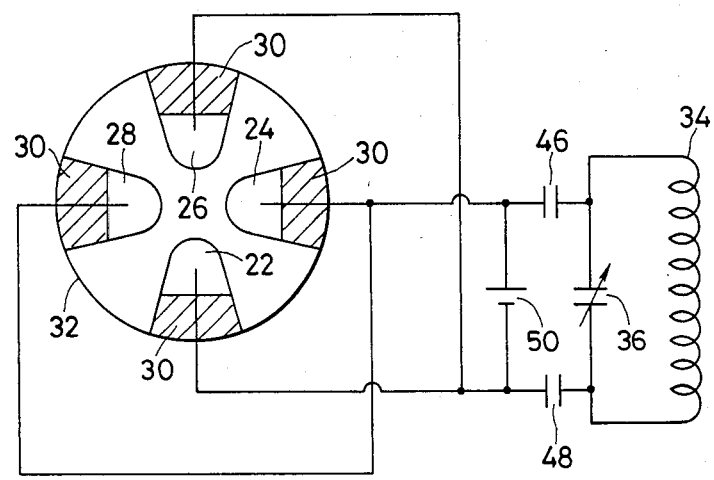
FIG. 6 is a diagram showing another embodiment.

FIG. 6 illustrates another embodiment of the present invention, wherein the same reference numerals as those of FIG. 5 denote the same members. Capacitors 46, 48 for d-c insulation work to apply a d-c voltage of a d-c power source 50 across the electrodes 22 and 26, and across the electrodes 24 and 28. The capacitors 46, 48 have capacities that are large enough to apply a radio-frequency voltage to the electrodes 22, 24, 26 and 28 without any hindrance. Thus, the d-c voltage and the radio-frequency voltage can be applied being superposed together across the electrodes 22 and 26, and across the electrodes 24 and 28. In addition to the radio-frequency electric field in the axial direction, therefore, there is formed an electric field which is the same as that of a quadrupole mass filter in a direction at right angles with the axis, making it possible to accelerate the ions and, at the same time, to analyze the mass.

Figure 4:
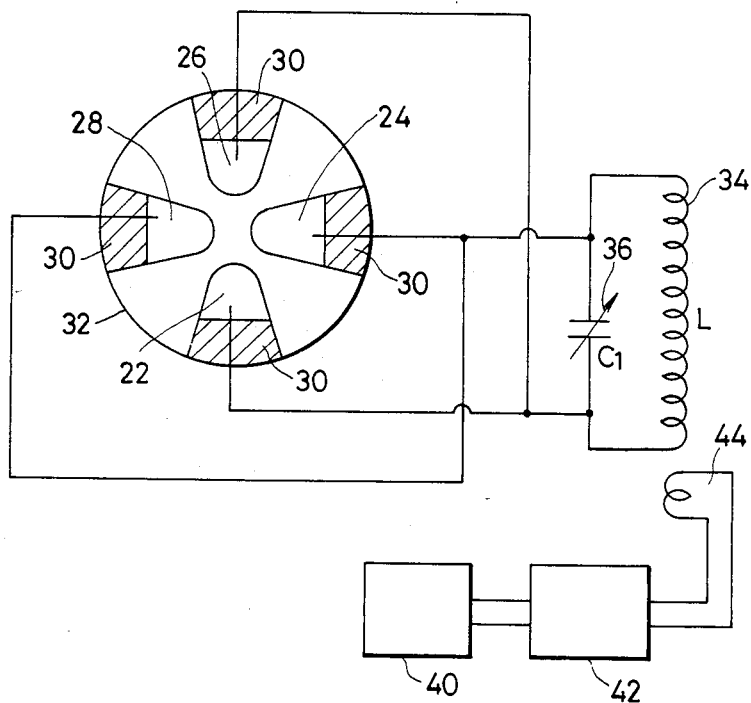
FIG. 4 is a diagram illustrating an embodiment of the present invention.

It will be obvious from the theory of electric circuit that the same effects are obtained even when a variable inductance is used instead of a variable capacitor to tune the frequency in the external resonance circuit of FIGS. 4 and 6.

Figure 7:
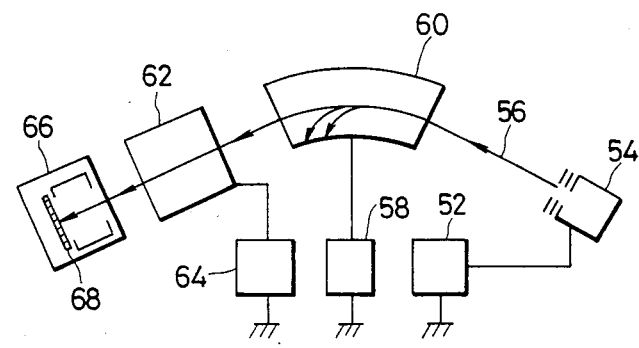
FIG. 7 and 8 are diagrams illustrating the constructions of ion implanters employing the accelerator of the present invention.

FIG. 7 illustrates an ion implanter employing the quadrupole charged particle accelerator according to the present invention. In FIG. 7, an ion beam 56 emitted from an ion source 54 that is driven by a drive source 52, is guided to a mass separator 60 that is driven by a drive source 58 and where desired ions are separated. The beam of separated ions is further accelerated by the radio-frequency quadrupole ion accelerator 62 of the present invention. The ion accelerator 62 is driven by a radio-frequency power source voltage 64. The accelerated ion beam is implanted into a sample substrate 68 in an ion implanting chamber 66.

If explained more concretely, a voltage having a frequency which is as high as several tens to several hundreds of megahertz is applied to the ion accelerator (RFQ) 62. Then, an acceleration field is established in the portion of center trajectory in the axial direction, and the ions are efficiently accelerated up to several megaelectron-volts. In this case, the RFQ 62 operates on ground potential in a d-c sense. Therefore, the ion source 54 and the mass separator 60 in the preceding stages thereof need not be powered by a high voltage and, hence, a very small load needs be carried by the power source. Further, the RFQ 62 needs be served with a voltage of several tens of kiloelectron-volts at the greatest. Therefore, no electric discharge takes place, and there is virtually no limit in the acceleration. According to this embodiment, an ion beam of several megaelectron-volts can be obtained efficiently, without requiring a high-voltage power source of large capacity that had been used thus far. In the practical experiments, a microwave ion source disclosed in Japanese Patent Publication Nos. 4056/1982, 11094/1982 and 41059/1982 was used as the ion source 54, and beams of ions such as B+, O+, N+, P+, and As+ separated at about 40 KeV were introduced into the RFQ resonator 62, and the beams having energies of the order of several megaelectron-volts and several milliamperes were implanted into the silicon substrate.

Figure 8:
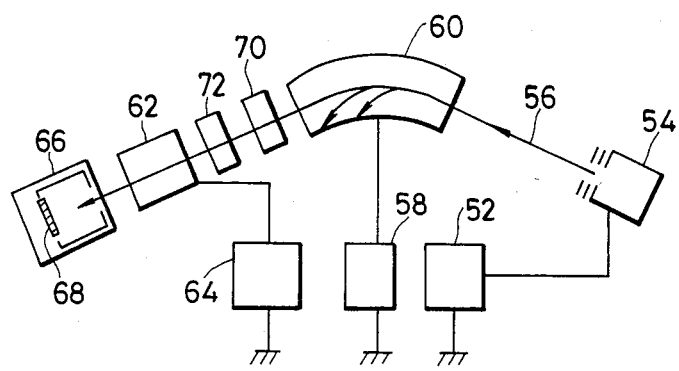

FIG. 8 illustrates another ion implanter employing the ion accelerator of the present invention. In the embodiment of FIG. 7, only a small proportion of beam current reaches the sample substrate 68 out of the beam emitted from the ion source 54.

When the ion beam is to be mass-separated, in general, the resolving power varies depending upon the beam width. To obtain a high resolving power, therefore, the cross section of beam at the outlet of ion source is usually elongated in the vertical direction. Therefore, the ion beam after the mass separation, usually, assumes an elongated shape in cross section. On the other hand, the inlet of the RFQ resonator has a circular shape which is several centimeters in diameter to permit the passage of the beam. Therefore, it is not allowed to increase the efficiency for utilizing the ion beam. It has now been experimentally clarified that the sectional shape of the beam must be changed to reduce losses associated with the beam current. FIG. 8 is a diagram which explains another embodiment of the present invention. That is, in FIG. 8, two stages of magnetic quadrupole lenses (that operate on a direct current) 70, 72 are used to change the sectional shape of the beam, i.e. to change the beam of an elongated shape in cross section into the beam of a circular shape in cross section so that it can be introduced into the RFQ 62, in order to increase the implanting current by more than two folds.

According to the embodiments mentioned in conjunction with FIGS. 7 and 8, the beam having an energy of the order of several hundred KeV to several MeV and several milliamperes can be obtained with the power source of a small capacity compared with the system in which the acceleration is effected in the subsequent stages to obtain the beam of a high energy. Namely, the present invention makes it possible to easily implant ions having high energies and, hence, to obtain great advantage when put into practice.

Figure 9:
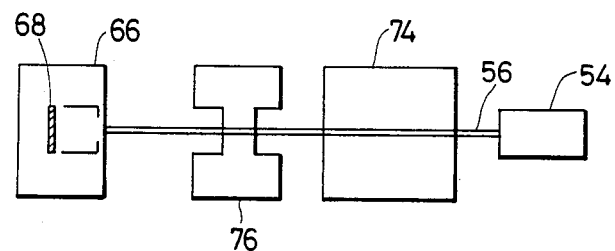
FIGS. 9 to 12 are diagrams illustrating the constructions of ion implanters employing a quadrupole ion accelerator.

A third embodiment will be explained below in conjunction with FIG. 9. Namely, the beam coming out of the RFQ 74 is introduced into a single-gap resonator 76 which is a kind of cavity resonator, in order to change the energy of implantation by utilizing the deceleration field that is generated responsive to the radio-frequency voltage that is applied. When the ions of a given kind are to be treated, therefore, the ions can be implanted at any desired energy using the same RFQ 74.

Figure 10:
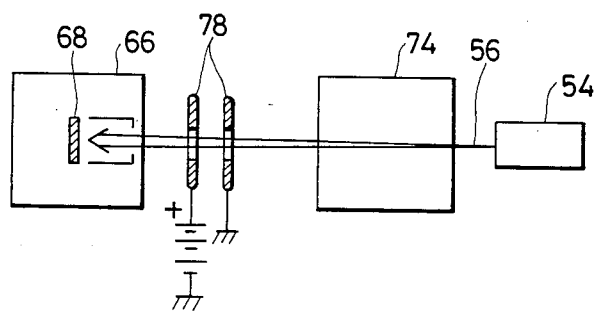

The same effects are also obtained by the deceleration electrode system in which a plurality of ring electrodes or plate electrodes 78, that have theretofore been used, are arranged as shown in FIG. 10, and ground potential is applied to the electrode of the first stage on the side.. of RFQ, and increasing voltages of the positive polarity are applied to the electrodes as they go toward the side of the sample.

Figure 11:
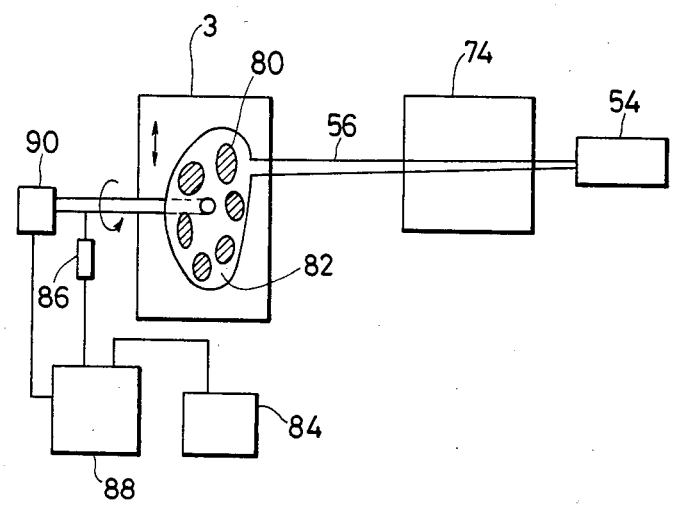

A fourth embodiment of the present invention is shown in FIG. 11. In implanting ions, in general, it is required to uniformly implant the ions by a predetermined dosage on the whole surfaces of the substrates such as silicon wafers and like substrates. For this purpose in FIG. 11, a number of sample substrates 80 are attached to the surface of a revolving disc 82 which is allowed to be mechanically moved even in the radial direction with respect to the ion beam 56, so that ions are uniformly implanted into the substrates 80. In this case, however, there arises a particular problem due to the use of RFQ 74. That is, even the beam 56 which is emitted in a d-c manner from the ion source 54 is bunched as it passes through the RFQ 74, and is transformed into a pulse-like beam consisting of masses of ions, the period of pulses being turned to the period of a radio-frequency voltage applied to the RFQ 74. Therefore, if the ratio of a rotation frequency $f_1$ of the disc 82 to a frequency $f_2$ of the radio-frequency voltage applied to the RFQ 74 forms a rational number, discrete places are irradiated with the beam on the revolving disc 82 depending upon the rational number. According to this embodiment, therefore, the rotation frequency $f_1$ is so selected that a distance between the closest two points among the discrete points is smaller than the diameter of the beam, such that the ions can be uniformly implanted in the circumferential direction. In the embodiment of FIG. 11, reference numeral 84 denotes a number generator which generates rational numbers of finite digits. The rational numbers are input to a differential amplifier 88 together with outputs from an encoder 86. The differential amplifier 88 produces an electric output depending upon the difference between them to so control the number of revolutions of a motor 90 that turns the disc that the difference will become zero between them.

Figure 12:
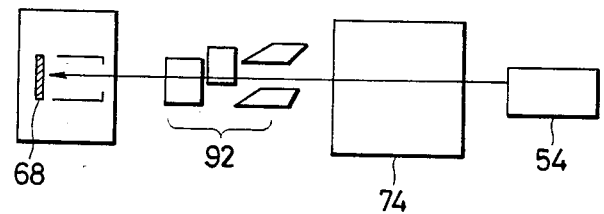

FIG. 12 shows a fifth embodiment according to the present invention, in which a beam-scanning electrode system 92 to scan the beam in the X- and Y-directions is provided between the RFQ 74 and the substrate 68, so that ions can be uniformly implanted into the substrate 68. In this case, the scanning frequency in the X- and Y-directions is selected to be smaller than the frequency of the voltage applied to the RFQ as shown in FIG. 12. The distance between two points among discrete points to be irradiated with the beam on the substrate 68, varies depending upon the voltage applied to the X- and Y-electrodes and the frequency of the voltage. In this embodiment, the distance between the closest two points is selected to be smaller than the diameter of the beam. Although FIG. 12 illustrates the embodiment where the electric field is used, the ions can also be implanted uniformly even with the XY-scanning system using magnetic coils.

According to the embodiments mentioned in the foregoing in conjunction with FIGS. 9 to 12, the ion beam emitted from the source of ions is passed through the RFQ to effect the mass separation as well as the acceleration of ions, simultaneously, making it possible to realize a simply constructed high-voltage ion implanter.

According to the present invention, furthermore, any kind of ions can be accelerated to any energy by the RFQ accelerator maintaining a high efficiency, making it possible to provide an ion implanter of a high energy and a heavy current.

What is claimed is:

1. A charged particle accelerator, comprising:
   quadrupole electrode means, including quadrupole electrodes in which opposing surfaces thereof are undulated, for accelerating charged particles;
   radio-frequency resonance circuit means, including a capacitor and a coil which constitute a part of a radio-frequency resonance circuit, for producing a high radio-frequency voltage and for applying the high radio-frequency voltage to said quadrupole electrodes, said radio-frequency resonance circuit means providing a variable resonance frequency; the variable resonance frequency being selected in accordance with the kind of charged particle ion to be accelerated, thereby enabling at least one of different kinds of charged particle ions to be properly accelerated without changing the size or spacing of the electrodes; and
   radio-frequency electric power generating means for applying radio-frequency electric power to said radio-frequency resonance circuit means.

2. A charged particle accelerator according to claim 1, wherein said radio-frequency resonance circuit means includes a plurality of radio-frequency resonance circuit means for producing a plurality of dissimilar radio-frequency voltages for superposed application to said quadrupole electrodes.

3. A charged particle accelerator according to claim 1, wherein the variable resonance frequency is selected so as to enable one of different kinds of charged particles ions to be accelerated at different energy levels.

4. A charged particle accelerator according to claim 1, wherein a DC voltage and an AC voltage are applied in a superposed manner to said quadrupole electrodes.

5. A charged particle accelerator according to claim 1, wherein the capacity of said capacitor of said radio-frequency resonance circuit means is variable.

6. A charged particle accelerator according to claim 1, wherein the inductance of said coil of said radio-frequency resonance circuit means is variable.

7. A charged particle accelerator according to claim 1, wherein said radio-frequency electric power generating means includes an oscillator, an amplifier for amplifying the output of said oscillator and a coupling coil for supplying the radio-frequency electric power produced by said amplifier to said radio-frequency resonance circuit means.

8. A charged particle accelerator according to claim 1, further comprising accelerating tube means for enclosing said quadrupole electrodes, and said capacitor and said coil of said radio-frequency resonance circuit means being disposed exteriorly of said accelerating tube means.

* * * * *